US011353914B2

(12) United States Patent
Toosizadeh et al.

(10) Patent No.: US 11,353,914 B2
(45) Date of Patent: Jun. 7, 2022

(54) WORKLOAD BASED ADAPTIVE VOLTAGE AND FREQUENCY CONTROL APPARATUS AND METHOD

(71) Applicant: Intel Corporation, Santa Clara, CA (US)

(72) Inventors: Navid Toosizadeh, San Diego, CA (US); Kamal Sinha, Folsom, CA (US); Altug Koker, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 154 days.

(21) Appl. No.: 16/823,221

(22) Filed: Mar. 18, 2020

(65) Prior Publication Data

US 2021/0294373 A1    Sep. 23, 2021

(51) Int. Cl.
*G06F 1/06*        (2006.01)
*H03L 7/099*       (2006.01)

(52) U.S. Cl.
CPC .............. *G06F 1/06* (2013.01); *H03L 7/0995* (2013.01)

(58) Field of Classification Search
CPC .................................. G06F 1/06; H03L 7/0995
See application file for complete search history.

(56) References Cited

U.S. PATENT DOCUMENTS

| 8,099,619 B2* | 1/2012 | Dibene ..................... G06F 1/26 713/500 |
| 9,628,089 B1 | 4/2017 | Jain |
| 10,009,016 B1 | 6/2018 | Ho et al. |
| 10,020,931 B2* | 7/2018 | Abdelmoneum ..... H03L 7/0995 |
| 10,587,250 B2* | 3/2020 | Hanke ..................... G06F 1/324 |
| 2019/0199363 A1 | 6/2019 | Kosonocky et al. |

OTHER PUBLICATIONS

Extended European Search Report dated Jun. 7, 2021 for EP Patent Application No. 20214750.0-1203.
Cortadella et al., "Ring Oscillator Clocks and Margins", 22nd IEEE International Symposium on Asynchronous Circuits and Systems, pp. 19-26, Oct. 2016.
Hashimoto et al., "An Adaptive-Clocking-Control Circuit With 7.5% Frequency Gain for SPARC Processors", IEEE Journal of Solid-State Circuits, vol. 53, Issue: 4, 2018.
Toosizadeh et al., "A 16 nm All-Digital Auto-Calibrating Adaptive Clock Distribution for Supply Voltage Droop Tolerance Across a Wide Operating Range", Journal of Solid-State Circuits 51(1): 8-17 (2016).
Toosizadeh et al., "VariPipe: Low-overhead Variable-clock Synchronous Pipelines", The 27th IEEE International Conference on Computer Design, pp. 117-124, Oct. 2009.
Toosizadeh et al., "Using Variable Clocking to Reduce Leakage in Synchronous Circuits", The 28th IEEE International Conference on Computer Design, pp. 328-335, Oct. 2010.

* cited by examiner

*Primary Examiner* — Diana J. Cheng
(74) *Attorney, Agent, or Firm* — Schwabe, Williamson & Wyatt, P.C.

(57) ABSTRACT

An all-digital closed-loop fine-grained control of voltage and frequency for running conditions of a compute machine such as graphic processor unit (GPU), central processing unit (CPU), or any other processing unit. The scheme optimizes the voltage margin and frequency on the fly according to desired programmable performance metrics. A mitigation response to droops is naturally built into the system and is equal to the cause rather than being excessive. The scheme is scalable and can be instantiated in different clusters for best results.

19 Claims, 6 Drawing Sheets

WORKLOAD BASED ADAPTIVE VOLTAGE AND FREQUENCY CONTROL APPARATUS AND METHOD

BACKGROUND

In most of today's modern application specific integrated circuit (ASIC) when a system having the ASIC is working under a given voltage and frequency point (V, F), voltage margins are applied to protect the system against worst-case voltage droops. This leaves excessive voltage, and therefore, power on the table when worst conditions are not happening. Graphics processing units (GPU) and other compute machines for three dimensional (3D) and machine learning applications see a variety of different workload behaviors while running applications. In machine learning applications, the machine can go from idle to heavy arithmetic operations which draw a lot of current instantaneously. On the other hand, 3D draw calls can cause a sudden di/dt event as well. It is very difficult to profile the voltage margins for the ASIC of such compute machines given the silicon inter- and intra-chip variations as well as the unlimited variety of applications. Usually the system is profiled for worst di/dt (droop) conditions and coarse voltage margins per voltage/frequency (V/F) operating modes are applied accordingly, which can be 10s of millivolts beyond the necessity for a lot of workloads. Additionally, a lot of times the design is not experiencing the highest level of activity.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
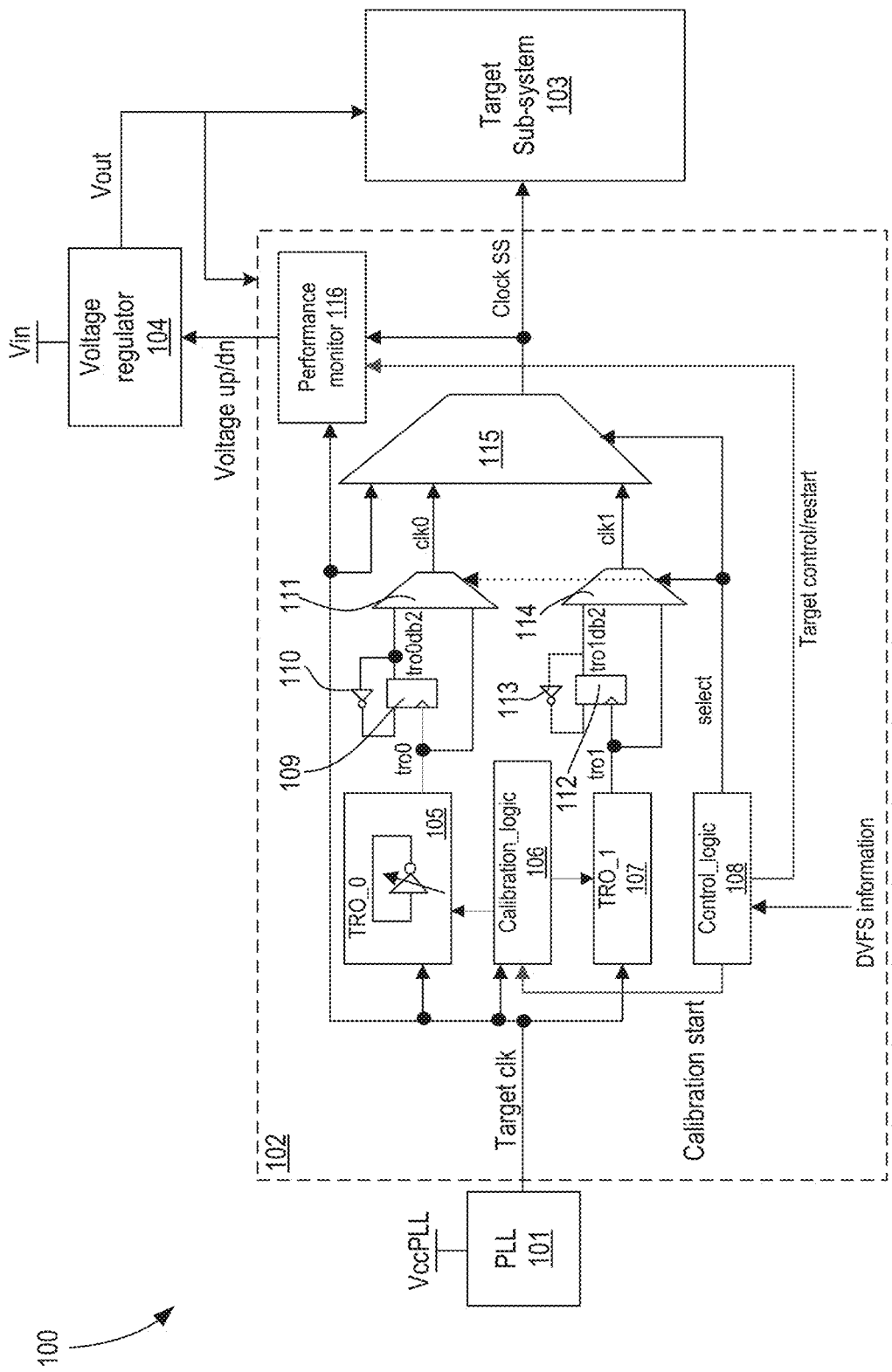
FIG. 1 illustrates an architecture of workload based adaptive voltage and frequency control, in accordance with some embodiments.

Voltage margins can be reduced using droop detectors to somewhat lower the voltage margins. When a droop is detected using a droop detector, mitigation happens to reduce the frequency to a lower value that is usually much lower than the nominal value. Voltage margins can also be controlled on the fly by detecting how many cycles were mitigated for droop. In this case, the system implements a closed-loop control for voltage in response to droops. However, its mitigation system is still costly since clock frequency is reduced aggressively in response to a droop. Due to the nature of mitigation response, the control of droop sensitivity as well as the amount of extra voltage margin reduction is limited. These solutions are either not scalable by nature or they do not close the loop between voltage and frequency control. This means power and performance can be improved. The problem is addressed by an apparatus and scheme of various embodiments.

In various embodiments, excess voltage margins are reduced for real world applications in a fine-grained manner with simultaneous best voltage reduction and the least performance impact. In some embodiments, the apparatus can be programmed to drive the computing system faster when it detects favorable running workload conditions. In some embodiments, an apparatus is provided with an all-digital closed-loop fine-grained control of voltage and frequency for the running conditions of a compute machine such as graphic processor unit (GPU), central processing unit (CPU), or any other processing unit. The apparatus and scheme of various embodiments optimizes the voltage margin and frequency on the fly according to the desired programmable performance metrics. In various embodiments, the mitigation response to droops is naturally built into the system and is equal to the cause rather than being excessive. The apparatus also controls both voltage and frequency in a fine-grained manner in a digital closed loop.

There are many technical effects of various embodiments. For example, today's computing machines can achieve the best performance per watt using the apparatus and scheme of the various embodiments. The apparatus enables voltage reductions or performance enhancements not possible with prior schemes. The cost of instantiating workload based adaptive voltage and frequency control, due to its small area, is negligible, especially when considering the amount of voltage margin reductions possible with this technique. The technology used in the apparatus and the scheme is scalable and can be instantiated in different clusters for best results if isochronicity is not needed. For example, GPU sub-tiles can instantiate this system separately. This helps in dealing with on-chip variations. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

Here, the term "analog signal" is any continuous signal for which the time varying feature (variable) of the signal is a representation of some other time varying quantity, i.e., analogous to another time varying signal.

Here, the term "digital signal" is a physical signal that is a representation of a sequence of discrete values (a quantified discrete-time signal), for example of an arbitrary bit stream, or of a digitized (sampled and analog-to-digital converted) analog signal.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates architecture 100 of workload based adaptive voltage and frequency control, in accordance with some embodiments. Architecture 100 comprises clock source 101, apparatus 102 for workload based adaptive voltage and frequency control, target sub-system or load 103, and voltage regulator 104. In some embodiments, clock source 101 comprises a phase locked loop (PLL) that generates a target clock (clk). In various embodiments, the power supply to operate clock source 101 is different from the power supply to operate apparatus 102. In this example, the power supply to PLL 101 is VccPLL which may be a dedicated quiet supply for PLL 101 while Vout is the power supply for apparatus 101 and target sub-system 103. In various embodiments, the power supply rail to PLL 101 is decoupled from the second power supply rail. While clock source 101 is shown as PLL 101, any suitable clock source can be used. For example, clock source 101 is a crystal oscillator, a frequency locked loop (FLL), an analog PLL, a mixed signal PLL, an all-digital PLL, an LC PLL etc.

In some embodiments, apparatus 102 comprises first ring oscillator (TRO_0) 105, calibration logic 106, second ring oscillator (TRO_1) 107, control logic 108, first flip-flop 109, first inverter 110, first multiplexer 111, second flip-flop 112, second inverter 113, second multiplexer 114, third multiplexer 115, and performance monitor 116. In various embodiments, first and second ring oscillators 105 and 107, respectively, comprise programmable delay stages which are coupled in a ring formation. Each delay stage may comprise an inverting logic such as adjustable delay inverter. In various embodiments, calibration logic 106 adjusts the delay of one or more delay stages of oscillators 105 and 107, respectively, so that frequencies of their output clocks tro0 and tro1, respectively, have same frequency as that of target clock from PLL 101.

While apparatus 102 illustrates two ring oscillators 105 and 107 with corresponding divide-by-two circuitries (e.g., flip-flops 109/112 and inverters 110/113), merely a single ring oscillator (e.g., 105) with corresponding divide-by-two circuits can be used. Having two ring oscillators 105/107 with corresponding divide-by-two circuitries allows apparatus 102 to calibrate one ring oscillator while the other ring oscillator is suppling clock as Clock SS.

First multiplexer 111 is controlled by control logic 108 to provide either tro0 as clk0 or tro0db2 as clk0. The clock tro0db2 is a clock which has a frequency half of the frequency of tro0. This divided-by-two clock (tro0db2) is achieved by flip-flop 109 and inverter 110 which is coupled to the output of flip-flip 109 and the input of flip-flop 109. In some embodiments, first multiplexer 111 selects the divided-by-2 clock tro0db2 when target sub-system 103 enters a safe mode.

In some embodiments, second multiplexer 114 is controlled by control logic 108 to provide either tro1 as clk0 or tro1db2 as clk1. The clock tro1db2 is a clock which has a frequency half of the frequency of tro1. This divided-by-two clock (tro1db2) is achieved by second flip-flop 112 and second inverter 113, which is coupled to the output of second flip-flip 112 and the input of second flip-flop 112. In some embodiments, second multiplexer 114 selects the divided-by-2 clock tro1db2 when target sub-system 103 enters a safe mode.

Third multiplexer 115 is also controlled by control logic 108 and provides the clock (Clock SS) to target sub-system 103 as its regular clock. Clock SS is monitored by performance monitor 116. Clock SS is selected as one of: clk0, clk1, or target clk. In some embodiments, multiplexers 111, 114, and 115 can be implemented in a single multiplexer.

In various embodiments, control logic 108 is responsible for handling changes in DVFS, switching between various clocks clk0, clk1, and Target clk, selecting between safe mode clock (e.g., tro0db2, tro1db2) and TRO clock (e.g., tro0 and tro1), starting calibration of inactive TRO (e.g., TRO_1 107), and controlling performance monitor 116.

In various embodiment, apparatus 102 addresses granular voltage/frequency control of compute machines (e.g., target sub-system 103) by using a tunable frequency and voltage modulation around workloads running on the sub-system 103. One goal of apparatus 102 is to achieve the performance goals of the product with optimum voltage margins applicable for the workload running on the machine at a given time. Architecture 100 observes the performance in a programmable amount of time (e.g., 1 millisecond) and applies voltage margin for the droops seen on the Vout power supply rail. Here, node names and signal names are interchangeably used. For example, Vout may refer to power supply voltage Vout or power supply rail Vout depending on the context of the sentence.

Architecture 100 naturally protects sub-system 103 by stretching the clock pulses for Clock SS while adjusting the voltage Vout when droops happens on Vout supply rail without any measurable impact to the performance of machine 103. Apparatus 102 can be instantiated multiple times in different regions of a die for best possible on-chip variation (OCV) results. Here, one instance of apparatus 102 is illustrated.

Each instance of apparatus 102 gets the Target clock as input from PLL 101 which is on a different voltage domain (e.g., VccPLL) than the voltage domain (e.g., Vout) of the instance of apparatus 102. Apparatus 102 outputs the clock SS to sub-system 103 as well as voltage control signals (e.g., Voltage up/dn) to the voltage regulator 104. Each instance of apparatus 102 comprises two Tunable Ring Oscillators (TRO) 105 and 107. As described in here, some embodiments of apparatus 102 can have one TRO (e.g., TRO 105).

In some embodiments, voltage regulator 104 (or voltage generator) comprises one or more of a buck DC-DC converter, boost DC-DC converter, buck-boost DC-DC converter, a low dropout (LDO) converter. Voltage regulator 104 receives an input supply Vin on an input power supply rail and generates a regulated output Vout on an output supply rail Vout. Voltage regulator 104 can receive instructions from one or more logics such as performance monitor 116 to control the output supply of Vout.

In some embodiments, calibration logic 106 (first circuitry) calibrates TROs 105 and 107. For example, calibration logic 106 adjusts the delay of one or more delay stages of oscillators 105 and 107 so that frequencies of their output clocks tro0 and tro1, respectively, have same frequency as that of target clock from PLL 101.

In some embodiments, at start-up, calibration logic 106 calibrates TRO_0 105 using the Target clk (clock) such that the TRO frequency (e.g., frequency of tro0) is almost equal to Target clk. Target clk can be set without extra traditional fixed clock margins, in one example. Once TRO 105 is calibrated, the period of tro0 clock is extended by a programmable margin in the delay stages of TRO 105 to account for OCV and other RO to data-path mismatches. At this point, control logic 108 switches the multiplexers 111, 114, and/or 115 to send TRO_0 output to sub-system 103

When a change in voltage or frequency is desired (e.g., DVFS), control logic 108 selects the divide-by-2 path for the active TRO (e.g. TRO_0 105) to put system 103 in a safe mode. The voltage Vout and Target clk frequency is then changed to the new DVFS target. Control logic 108 signals calibration logic 106 to calibrate the non-active TRO (e.g. TRO_1 107). Control logic 108 then switches the output clock to the output clk1 from the newly calibrated TRO (e.g. TRO_1 107). This ping-pong mechanism ensures a smooth change in the set V/F point, in accordance with some embodiments.

In some embodiments, control logic 108 handles voltage and frequency change requests. For example, during dynamic voltage and frequency mode (DVFS mode), control logic 108 may cause multiplexers 111 and 114 to select divide-by-2 clocks tro0db2 or tro1db2 as clocks clk0 and clk1, respectively. In another example, during DVFS mode, control logic may restart the counters of performance monitor 116 (second circuitry).

In some embodiments, performance monitor 116 adjusts voltage Vout based on performance targets. Performance monitor 116 may include one or more counters that count the frequency of clock SS and compare it with the frequency of target clk. Depending on the difference relative to a threshold, performance monitor 116 may instruct (via Voltage up/dn) voltage regulator 104 to increase or decrease the voltage level of Vout. Using TROs, the clock rate of Clock SS is adjusted to present voltage, and temperature.

In some embodiments, performance monitor 116 has a counter on the PLL clock domain (Target clk) as well as a counter on the TRO clock domain (e.g., one of clk0 or clk1). Performance monitor 116 compares the two counts out of these counters in a programmable duration of time to judge if TRO 105/107 is meeting the required performance In some embodiments, performance monitor 116 is programmed for a range of acceptable performance with hysteresis thresholds. For example, performance monitor 116 can be programmed to ensure the counter on the TRO domain is within ±0.5% (or any suitable threshold) of the counter on the PLL domain. If it is not within the range for several measurement periods (e.g., 10 cycles), corrective action is imposed by performance monitor 116 by signaling the voltage regulator 104 to reduce the voltage or increase the voltage. Consequently, TRO 105/107 slows down, or speeds up based on the change in response to the voltage change in Vout.

Apparatus 102 removes most of the traditional fixed-clock margins. Apparatus 102 is a digital closed loop V/F control that regulates Clock SS and voltage Vout according to the running workload on system 103. At first, TRO 105 is calibrated, with a programmable margin, to have an output clock tro0 equal to the PLL Target clk frequency. Without any workload (and droops), the frequency of tro0 will be equal to that of PLL output target clk. When the workload on target sub-system 103 is lighter with less voltage droops, TRO 105 oscillates faster. In some embodiments, performance monitor 116 detects this condition and signals voltage regulator 104 to reduce the voltage on Vout supply rail and save power.

When workload on target sub-system 103 suddenly presents larger droops, apparatus 102 automatically slows down the Clock SS to protect sub-system 103. This happens naturally because TRO 105 is supplied with the same power rail voltage Vout as the rest of the sub-system 103. The amount of clock slow-down of Clock SS response is proportional to the magnitude of the droop on Vout. In the meantime, Vout voltage is raised by instructions from performance monitor 116 to increase the oscillation speed of TRO 105 and meet performance requirements.

In various embodiments, TRO 105 and sub-system 103 are under the same voltage and frequency (V/F). To the first order, TRO 105 is custom designed to match the same sensitivity to droops as the critical blocks of the sub-system 103. TRO 105 has programmability to account for sensitivity mismatches between the design of sub-system 103 and TRO 105. In various embodiments, TROs 105/107 have fine grained tunable delay elements. In a large system, multiple instances of apparatus 102 units may be instantiated for best local OCV mismatch handling.

Continuous performance measurements by performance monitor 116 determines if the required performance is met. The number of measurements before changing voltage, duration of time for each measurement as well as the voltage step change in each direction are programmable. The performance counters of performance monitor 116 can signal different voltage change steps to voltage regulator 104 based on the delta between the two performance counters. In some embodiments, the performance counter is set to lower the voltage of Vout when there is not much voltage droops, or it can be set to take advantage of such conditions and boost performance.

While the various embodiments describe oscillators as ring oscillators such as voltage controlled oscillators (VCOs) or digitally controlled oscillator (DCOs), they can also be LC (inductor-capacitor) tank oscillators.

Figure 2:
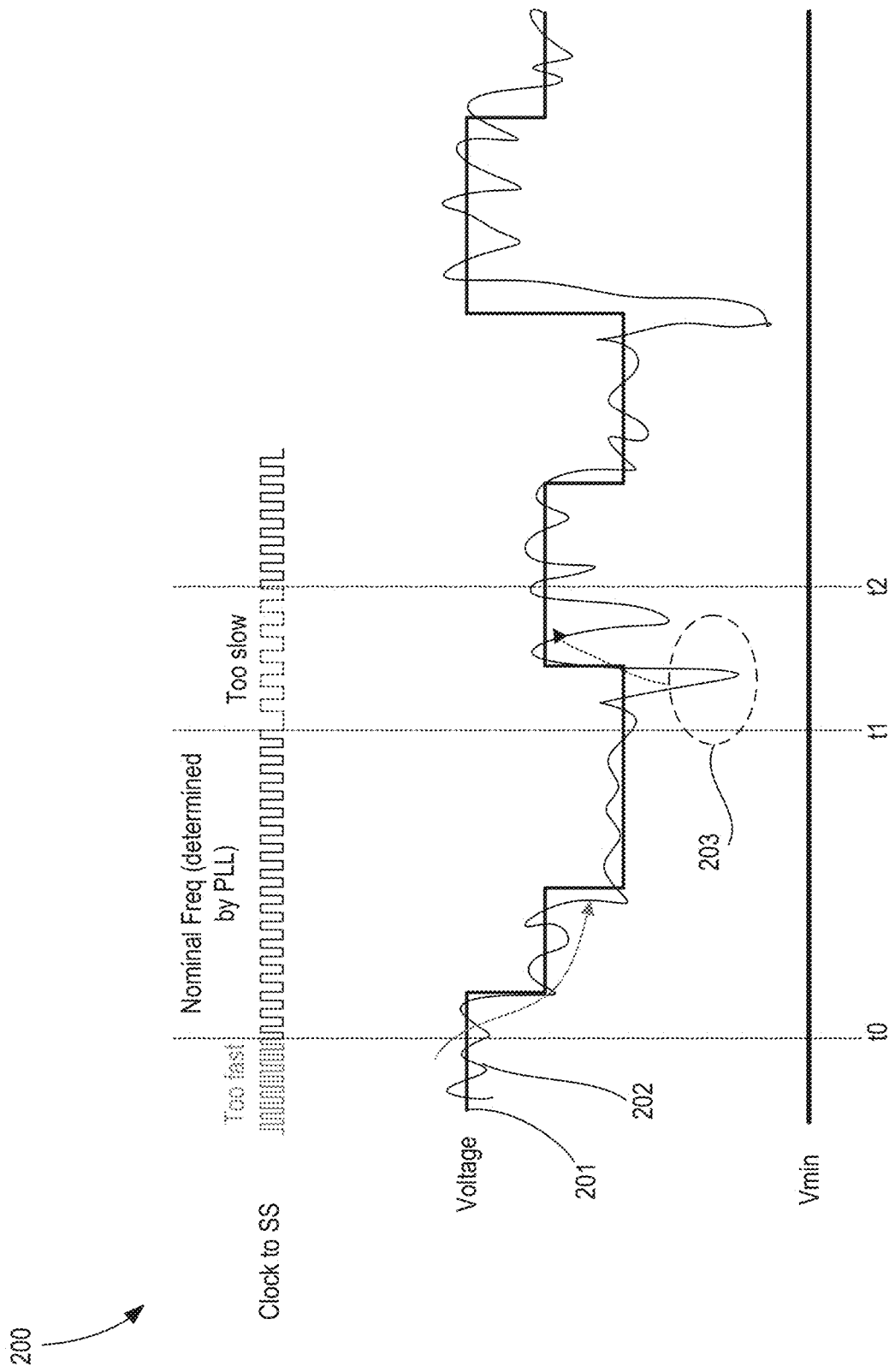
FIG. 2 illustrates a plot showing operation of the architecture of FIG. 1, in accordance with some embodiments.

FIG. 2 illustrates plot 200 showing operation of the architecture of FIG. 1, in accordance with some embodiments. Plot 200 illustrates output 201 of performance monitor 116, voltage 202 on Vout supply rail, and droop 203 on Vout supply rail. Vmin in plot 200 illustrates the minimum operating voltage for system 103 to function. Supply voltage below Vmin causes system 103 to lose data and not malfunction. Plot 200 illustrates frequency change of Clock SS as voltage 202 on Vout rail changes. When there is no high droop activity due to lighter workload by system 103, as indicated by time t0 and earlier, TRO 105 starts to oscillate faster than Target clk. In this case, the V/F closed loop of apparatus 102 lowers the voltage on Vout. During normal workload, TRO 105 oscillation frequency is substantially same as that of Target clk. This is illustrated by the duration between t0 and t1. When workload by system 103 gets heavy, TRO 105 becomes slower automatically (e.g., frequency of tro1) becomes slower) and protects system 103 against voltage droops. This is indicated by the duration t1 to t2. The V/F closed loop of apparatus 102 then increases the voltage Vout to adjust the speed of TRO 105 back to the programmed or calibrated level.

Figure 3:
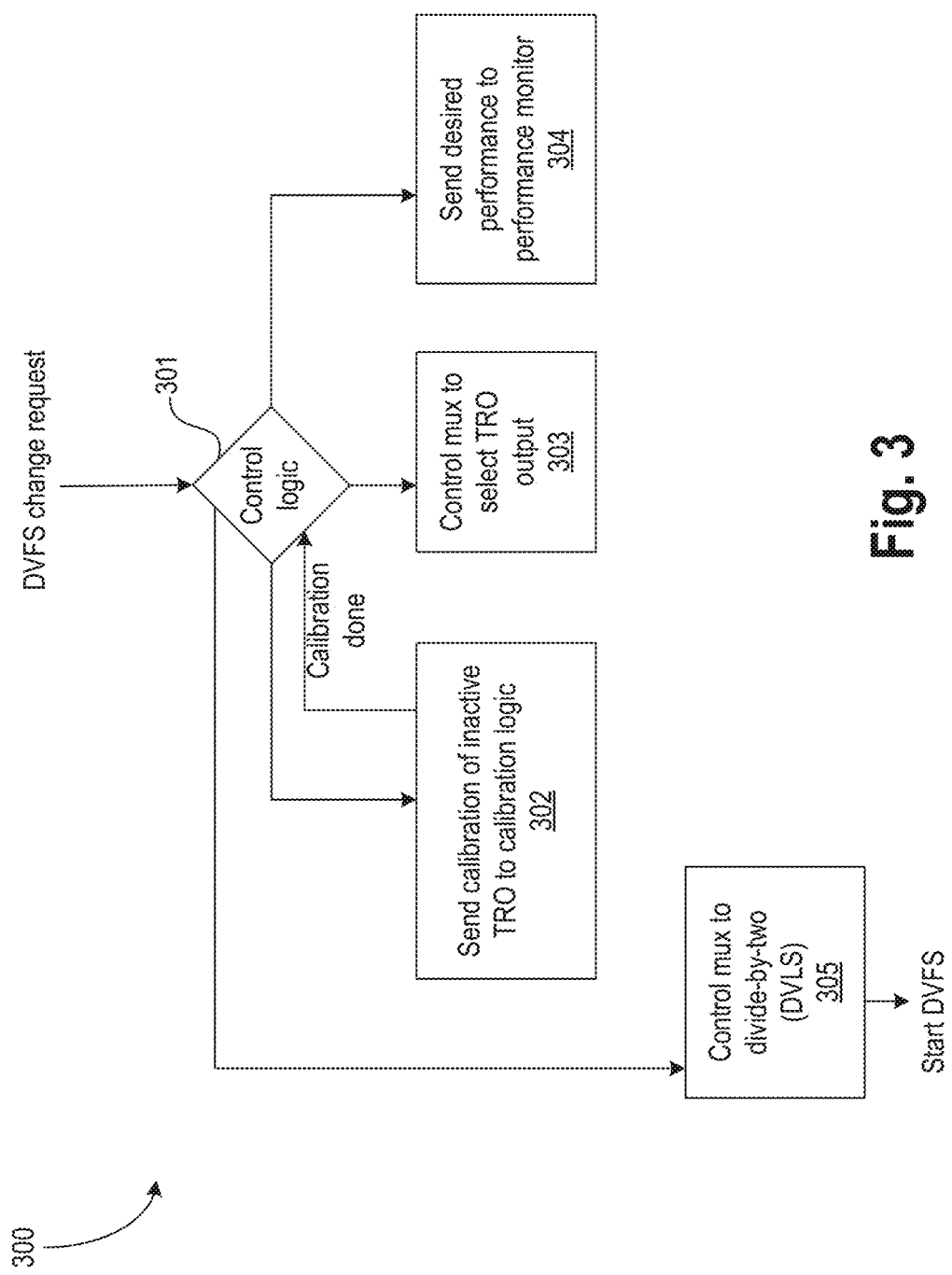
FIG. 3 illustrates a flowchart showing operation of the architecture of FIG. 1, in accordance with some embodiments.

FIG. 3 illustrates flowchart 300 showing operation of the architecture of FIG. 1, in accordance with some embodiments. In some embodiments, control logic 108 (301) causes third multiplexer 115 to select clk0 derived from TRO_0 105 while TRO_1 107 is calibrated by calibration logic 106 as illustrated by block 302. In this example, TRO_1 107 is the inactive oscillator. As discussed herein, calibration logic 106 calibrates TRO_1 107 using the Target clk such that the TRO frequency (e.g., frequency of tro1) is almost equal, equal, or substantially equal to Target clk. Upon completing the calibration, a calibration done signal is asserted and informed to control logic 301/108. The control logic then calibrates TRO_0 105, which becomes an inactive oscillator while third multiplexer 115 is caused to select clk1 derived from TRO_1 107. This ping-pong mechanism ensures a smooth change in the set V/F point, in accordance with some embodiments.

In some embodiments, control logic 301/108 controls multiplexers 111, 114, and 115 to select the oscillator output as illustrated by block 303. For example, for start-up, trot) and clk0 are selected for Clock SS.

In some embodiments, control logic 301/108 sends desired performed target to performance monitor 116 as illustrated by block 304. For example, control logic 301/108 instructs performance monitor 116 to restart (e.g., reset its counters) and/or to measure the frequency of Clock SS and compare it against the frequency of Target Clk.

In some embodiments, upon receiving DVFS (dynamic voltage and frequency scaling) change request from system 103, control logic 108 (or 301) controls multiplexers 114 and 115 select divide-by-2 clocks as illustrated by block 305. Control logic 301/108 can be implemented in software, hardware, or a combination of them. In some embodiments, function of control logic 301/108 can be controlled by software and/or hardware.

Figure 4:
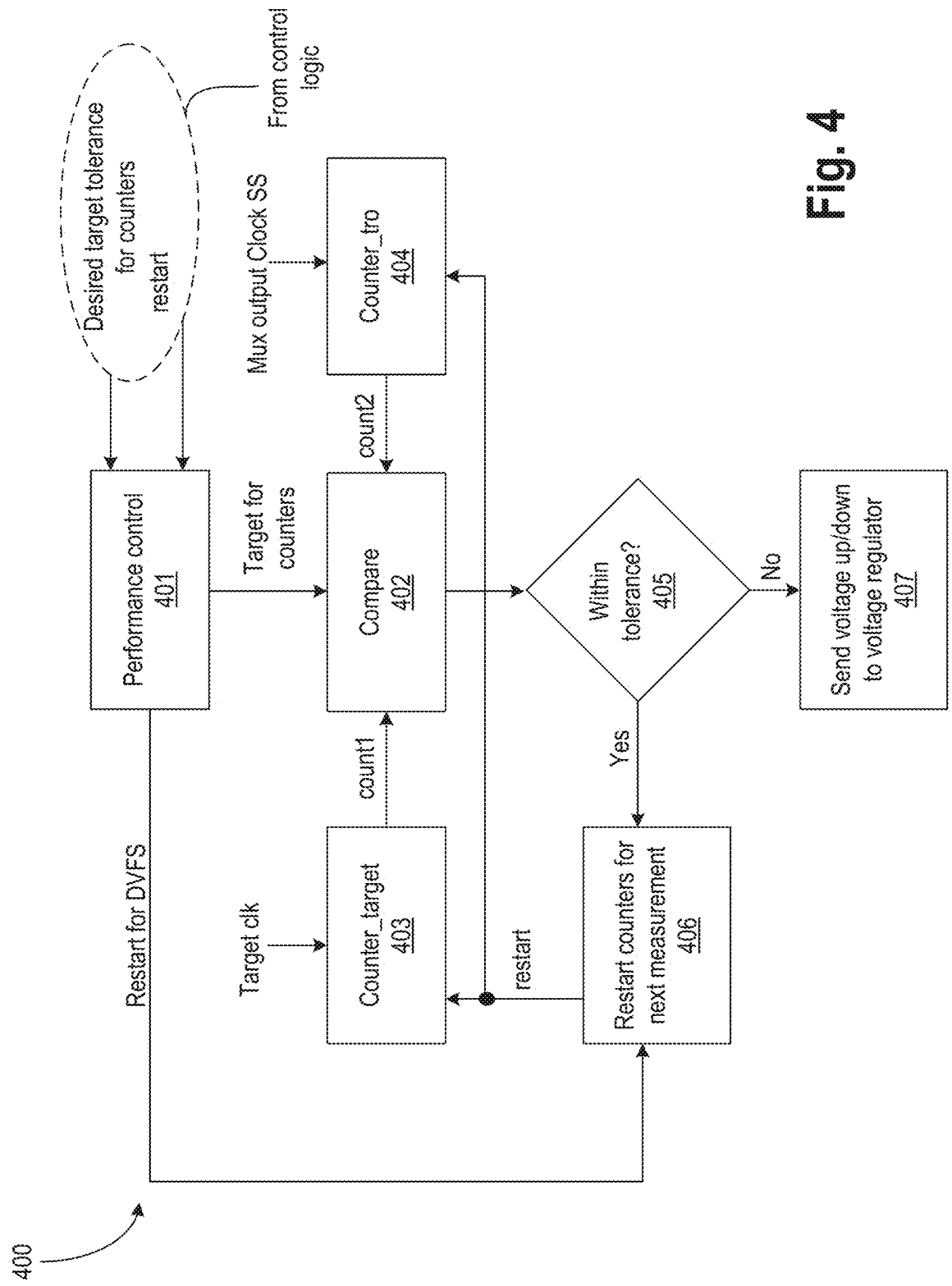
FIG. 4 illustrates a flowchart showing operation of the performance monitor of the architecture of FIG. 1, in accordance with some embodiments.

FIG. 4 illustrates flowchart 400 showing operation of performance monitor 116 of the architecture of FIG. 1, in accordance with some embodiments. While the various blocks are shown in a particular order, the order can be modified. For example, some blocks can be performed in parallel, simultaneously, or out-of-order. In some embodiments, performance monitor 116 receives one or more instructions from control logic 108 including desired target tolerances for the counters of performance monitor 116, and whether the counters should be reset (via restart command) as indicated by block 401. Performance monitor 116 includes one or more comparators that compare the count values count1 and count2 from the two counters of performance monitor 116 as illustrated by block 402. In some embodiments, a first counter counts the rising and/or falling edges of Target Clk as indicated by block 403, and generates a resulting count1. In some embodiments, a second counter counts the rising and/or falling edges of Clock SS as indicated by block 404, and generates a resulting count2.

At block 405, a determination is made whether the difference between count1 and count2 is within the programmable threshold (e.g., within 1 cycle). If the difference between count1 and count2 is within the programmable threshold, the process proceeds to block 406 where performance monitor 116 restarts the two counters for next measurement. If the difference between count1 and count2 is outside the programmable threshold, the process proceeds to block 407 where performance monitor 116 instructs voltage regulator 103 to raise or lower its output voltage Vout in accordance with the up/down signal. Upon receiving a restart command from control logic 108 because system 103 enters in DVFS mode, then performance monitor 116 restarts the counters. Performance monitor 116 can be implemented in software, hardware, or a combination of them. In some embodiments, function of performance monitor 116 can be controlled by software and/or hardware. In some embodiments, performance monitor 116 is programmed to do multiple measurements before making a decision (e.g., hysteresis).

Figure 5:
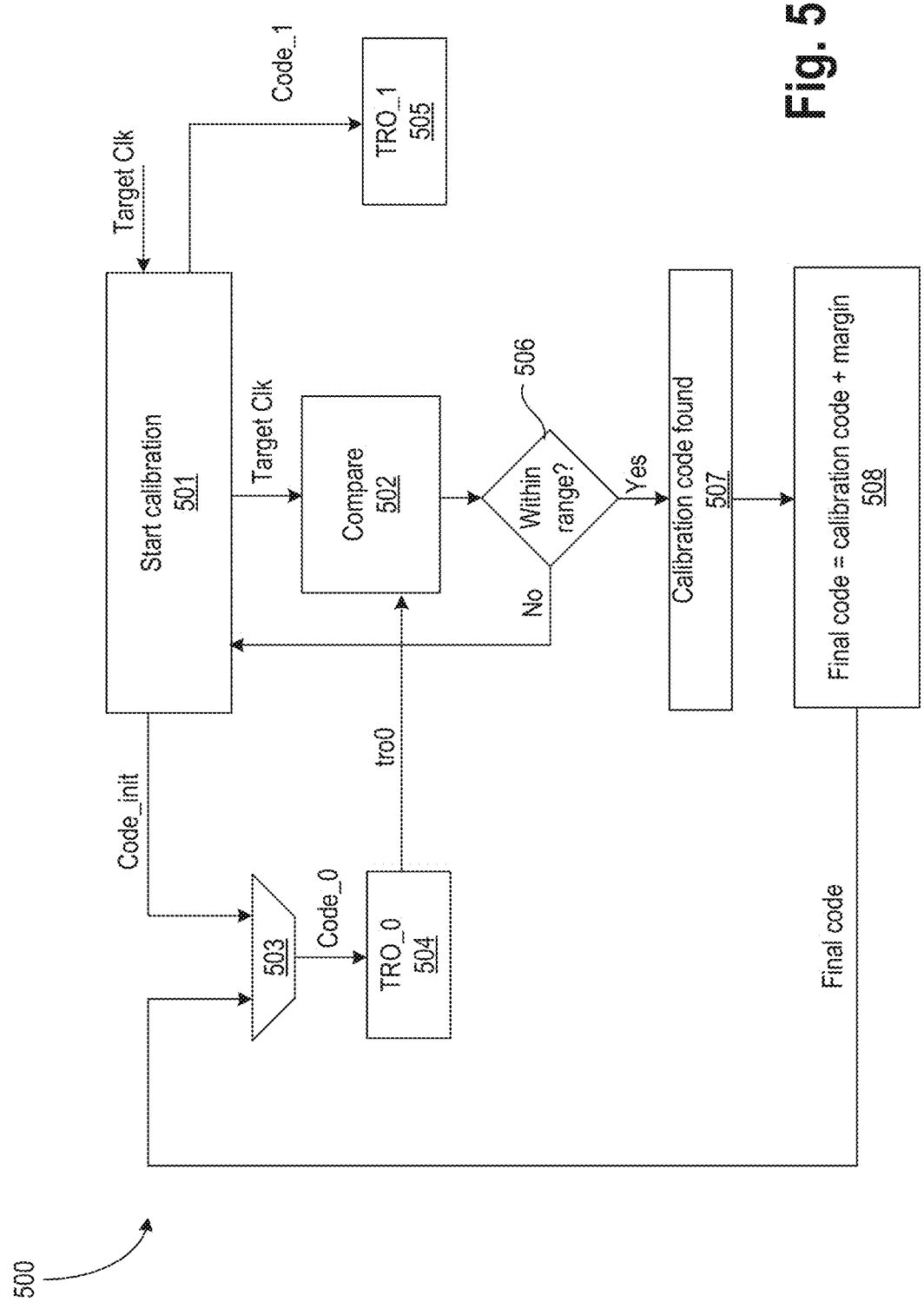
FIG. 5 illustrates a flowchart showing the operation of calibration logic of the architecture of FIG. 1, in accordance with some embodiments.

FIG. 5 illustrates flowchart 500 showing the operation of calibration logic 106 of the architecture of FIG. 1, in accordance with some embodiments. While the various blocks are shown in a particular order, the order can be modified. For example, some blocks can be performed in parallel, simultaneously, or out-of-order. At block 501 calibration starts. In some embodiments, calibration logic 106 includes a comparator. At block 502, the comparator compares the frequency of the Target clk and the output of TRO 105/107 (depending on which one is being calibrated). In this example, TRO_0 105 is being calibrated while TRO_1 107 (505) receives a preconfigured code, Code_1.

At block 506, a determination is made whether the Target clk and the output of the TRO are within a programmable threshold range (e.g., few MHz). If the frequencies of Target Clk and the output of TRO are within the programmable threshold range, then the process proceeds to block 507, and the calibration code is found. The calibration code represents the digital code that sets the delay of the delay stages of the TRO that results in an output frequency which is substantially the same as the frequency of Target clk. Block 508 establishes the final code for calibration which is the code achieved from block 508 with some margin. The margin can be 0 to any suitable programmable amount. The final code is them provided to the to-be calibrated TRO (in this example TRO_0 105) at block 504 via multiplexer 503. Initially, TRO 105 (or the to-be calibrated TRO) is provided with an initial calibration code (Code_init) via multiplexer 503.

If the frequencies of Target Clk and the output of TRO are not within the programmable threshold range, the process of calibration starts again. Calibration logic 106 can be implemented in software, hardware, or a combination of them. In some embodiments, function of calibration logic 106 can be controlled by software and/or hardware.

Figure 6:
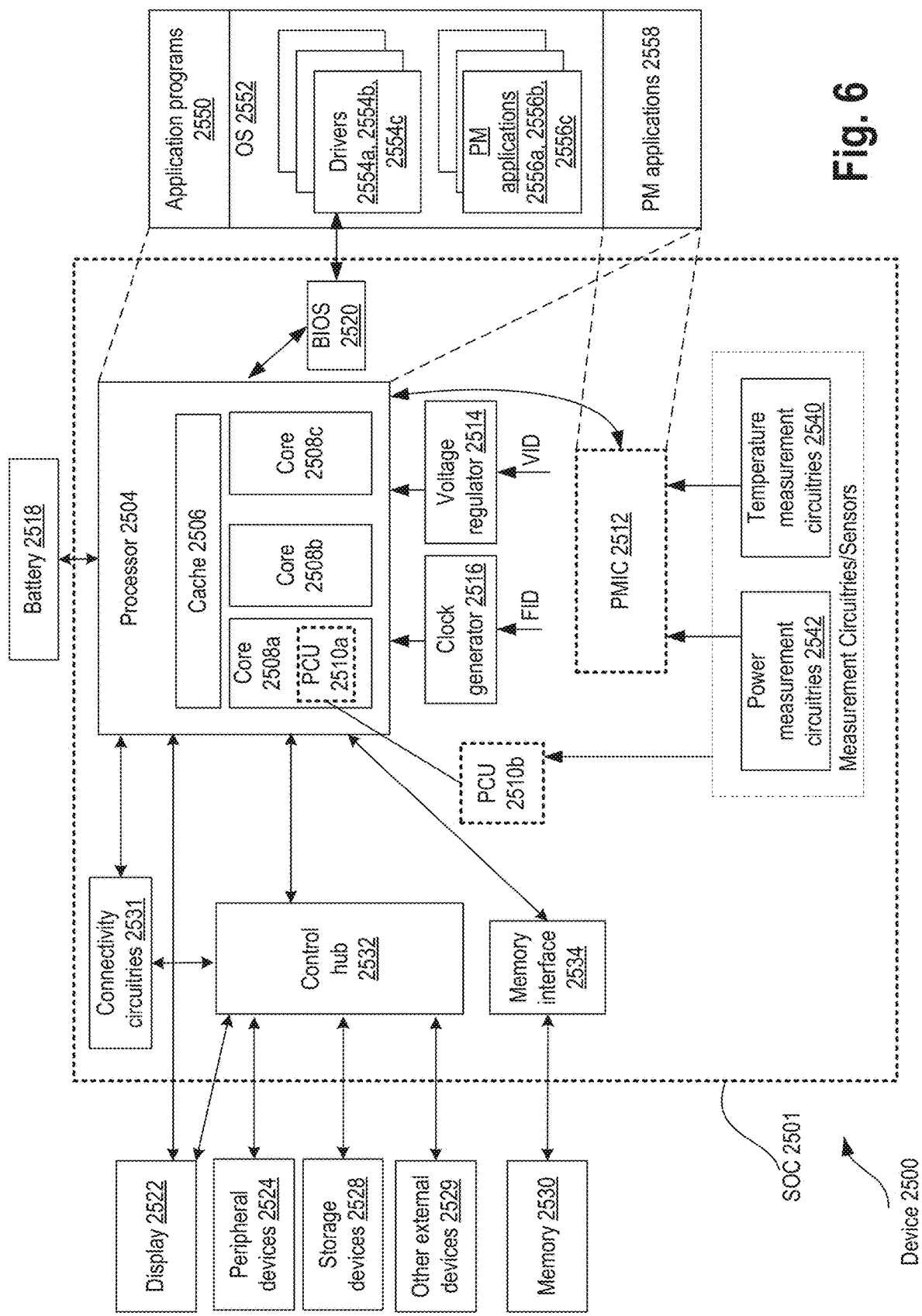
FIG. 6 illustrates a smart device, or a computer system, or a SoC (System-on-Chip) with workload based adaptive voltage and frequency control, according to some embodiments of the disclosure.

FIG. 6 illustrates a smart device, or a computer system, or a SoC (System-on-Chip) with workload based adaptive voltage and frequency control, according to some embodiments of the disclosure. In some embodiments, device 2500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2500. Any components here can have the workload based adaptive voltage and frequency control apparatus/method of various embodiments.

In an example, the device 2500 comprises a SoC (System-on-Chip) 2501. An example boundary of the SOC 2501 is illustrated using dotted lines in FIG. 6, with some example components being illustrated to be included within SOC 2501—however, SOC 2501 may include any appropriate components of device 2500.

In some embodiments, device 2500 includes processor 2504. Processor 2504 can include one or more physical devices, such as microprocessors, application processors, microcontrollers, programmable logic devices, processing cores, or other processing means. The processing operations performed by processor 2504 include the execution of an operating platform or operating system on which applications and/or device functions are executed.

The processing operations include operations related to I/O (input/output) with a human user or with other devices, operations related to power management, operations related to connecting computing device 2500 to another device, and/or the like. The processing operations may also include operations related to audio I/O and/or display I/O.

In some embodiments, processor 2504 includes multiple processing cores (also referred to as cores) 2508a, 2508b, 2508c. Although merely three cores 2508a, 2508b, 2508c are illustrated, processor 2504 may include any other appropriate number of processing cores, e.g., tens, or even hundreds of processing cores. Processor cores 2508a, 2508b, 2508c may be implemented on a single integrated circuit (IC) chip. Moreover, the chip may include one or more shared and/or private caches, buses or interconnections, graphics and/or memory controllers, or other components.

In some embodiments, processor 2504 includes cache 2506. In an example, sections of cache 2506 may be dedicated to individual cores 2508 (e.g., a first section of cache 2506 dedicated to core 2508a, a second section of cache 2506 dedicated to core 2508b, and so on). In an example, one or more sections of cache 2506 are shared among two or more of cores 2508. Cache 2506 may be split in different levels, e.g., level 1 (L1) cache, level 2 (L2) cache, level 3 (L3) cache, etc.

In some embodiments, processor core 2504 may include a fetch unit to fetch instructions (including instructions with conditional branches) for execution by the core 2504. The instructions are fetched from any storage devices such as the memory 2530. Processor core 2504 may also include a decode unit to decode the fetched instruction. For example, the decode unit may decode the fetched instruction into a plurality of micro-operations. Processor core 2504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2504 may be an out-of-order processor core in one embodiment. Processor core 2504 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 2504 may also include a bus unit to enable communication between components of the processor core 2504 and other components via one or more buses. Processor core 2504 may also include one or more registers to store data accessed by various components of the core 2504 (such as values related to assigned app priorities and/or sub-system states (modes) association.

In some embodiments, device 2500 comprises connectivity circuitries 2531. For example, connectivity circuitries 2531 includes hardware devices (e.g., wireless and/or wired connectors and communication hardware) and/or software components (e.g., drivers, protocol stacks), e.g., to enable device 2500 to communicate with external devices. Device 2500 may be separate from the external devices, such as other computing devices, wireless access points or base stations, etc.

In an example, connectivity circuitries 2531 may include multiple different types of connectivity. To generalize, the connectivity circuitries 2531 may include cellular connectivity circuitries, wireless connectivity circuitries, etc. Cellular connectivity circuitries of connectivity circuitries 2531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2531 may include a network interface, such as a wired or wireless interface, e.g., so that a system embodiment may be incorporated into a wireless device, for example, cell phone or personal digital assistant.

In some embodiments, device 2500 comprises control hub 2532, which represents hardware devices and/or software components related to interaction with one or more I/O devices. For example, processor 2504 may communicate with one or more of display 2522, one or more peripheral devices 2524, storage devices 2528, one or more other external devices 2529, etc., via control hub 2532. Control hub 2532 may be a chipset, a Platform Control Hub (PCH), and/or the like.

For example, control hub 2532 illustrates one or more connection points for additional devices that connect to device 2500, e.g., through which a user might interact with the system. For example, devices (e.g., devices 2529) that can be attached to device 2500 include microphone devices, speaker or stereo systems, audio devices, video systems or other display devices, keyboard or keypad devices, or other I/O devices for use with specific applications such as card readers or other devices.

As mentioned above, control hub 2532 can interact with audio devices, display 2522, etc. For example, input through a microphone or other audio device can provide input or commands for one or more applications or functions of device 2500. Additionally, audio output can be provided instead of, or in addition to display output. In another example, if display 2522 includes a touch screen, display 2522 also acts as an input device, which can be at least partially managed by control hub 2532. There can also be additional buttons or switches on computing device 2500 to provide I/O functions managed by control hub 2532. In one embodiment, control hub 2532 manages devices such as accelerometers, cameras, light sensors or other environmental sensors, or other hardware that can be included in device 2500. The input can be part of direct user interaction, as well as providing environmental input to the system to influence its operations (such as filtering for noise, adjusting displays for brightness detection, applying a flash for a camera, or other features).

In some embodiments, control hub 2532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2522 represents hardware (e.g., display devices) and software (e.g., drivers) components that provide a visual and/or tactile display for a user to interact with device 2500. Display 2522 may include a display interface, a display screen, and/or hardware device used to provide a display to a user. In some embodiments, display 2522 includes a touch screen (or touch pad) device that provides both output and input to a user. In an example, display 2522 may communicate directly with the processor 2504. Display 2522 can be one or more of an internal display device, as in a mobile electronic device or a laptop device or an external display device attached via a display interface (e.g., DisplayPort, etc.). In one embodiment display 2522 can be a head mounted display (HMD) such as a stereoscopic display device for use in virtual reality (VR) applications or augmented reality (AR) applications.

In some embodiments and although not illustrated in the figure, in addition to (or instead of) processor 2504, device 2500 may include Graphics Processing Unit (GPU) comprising one or more graphics processing cores, which may control one or more aspects of displaying contents on display 2522.

Control hub 2532 (or platform controller hub) may include hardware interfaces and connectors, as well as software components (e.g., drivers, protocol stacks) to make peripheral connections, e.g., to peripheral devices 2524.

It will be understood that device 2500 could both be a peripheral device to other computing devices, as well as have peripheral devices connected to it. Device 2500 may have a "docking" connector to connect to other computing devices for purposes such as managing (e.g., downloading and/or uploading, changing, synchronizing) content on device 2500. Additionally, a docking connector can allow device 2500 to connect to certain peripherals that allow computing device 2500 to control content output, for example, to audiovisual or other systems.

In addition to a proprietary docking connector or other proprietary connection hardware, device 2500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2531 may be coupled to control hub 2532, e.g., in addition to, or instead of, being coupled directly to the processor 2504. In some embodiments, display 2522 may be coupled to control hub 2532, e.g., in addition to, or instead of, being coupled directly to processor 2504.

In some embodiments, device 2500 comprises memory 2530 coupled to processor 2504 via memory interface 2534. Memory 2530 includes memory devices for storing information in device 2500. Memory can include nonvolatile (state does not change if power to the memory device is interrupted) and/or volatile (state is indeterminate if power to the memory device is interrupted) memory devices. Memory device 2530 can be a dynamic random access memory (DRAM) device, a static random access memory (SRAM) device, flash memory device, phase-change memory device, or some other memory device having suitable performance to serve as process memory. In one embodiment, memory 2530 can operate as system memory for device 2500, to store data and instructions for use when the one or more processors 2504 executes an application or process. Memory 2530 can store application data, user data, music, photos, documents, or other data, as well as system data (whether long-term or temporary) related to the execution of the applications and functions of device 2500.

Elements of various embodiments and examples are also provided as a machine-readable medium (e.g., memory 2530) for storing the computer-executable instructions (e.g., instructions to implement any other processes discussed herein). The machine-readable medium (e.g., memory 2530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2500 comprises temperature measurement circuitries 2540, e.g., for measuring temperature of various components of device 2500. In an example, temperature measurement circuitries 2540 may be embedded, or coupled or attached to various components, whose temperature are to be measured and monitored. For example, temperature measurement circuitries 2540 may measure temperature of (or within) one or more of cores 2508a, 2508b, 2508c, voltage regulator 2514, memory 2530, a mother-board of SOC 2501, and/or any appropriate component of device 2500.

In some embodiments, device 2500 comprises power measurement circuitries 2542, e.g., for measuring power consumed by one or more components of the device 2500. In an example, in addition to, or instead of, measuring power, the power measurement circuitries 2542 may measure voltage and/or current. In an example, the power measurement circuitries 2542 may be embedded, or coupled or attached to various components, whose power, voltage, and/or current consumption are to be measured and monitored. For example, power measurement circuitries 2542 may measure power, current and/or voltage supplied by one or more voltage regulators 2514, power supplied to SOC 2501, power supplied to device 2500, power consumed by processor 2504 (or any other component) of device 2500, etc.

In some embodiments, device 2500 comprises one or more voltage regulator circuitries, generally referred to as voltage regulator (VR) 2514. VR having a high bandwidth and low power differential-to-single-ended type-III compensator. VR 2514 generates signals at appropriate voltage levels, which may be supplied to operate any appropriate components of the device 2500. Merely as an example, VR 2514 is illustrated to be supplying signals to processor 2504 of device 2500. In some embodiments, VR 2514 receives one or more Voltage Identification (VID) signals, and generates the voltage signal at an appropriate level, based on the VID signals. Various type of VRs may be utilized for the VR 2514. For example, VR 2514 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 2510a/b and/or PMIC 2512. In some embodiments, each core has a network of distributed LDOs to provide efficient control for power management. The LDOs can be digital, analog, or a combination of digital or analog LDOs. The VR is an adaptive VR that can provide an adaptive voltage output as discussed with reference to various embodiments.

In some embodiments, device 2500 comprises one or more clock generator circuitries, generally referred to as clock generator 2516. Clock generator 2516 generates clock signals at appropriate frequency levels, which may be supplied to any appropriate components of device 2500. Merely as an example, clock generator 2516 is illustrated to be supplying clock signals to processor 2504 of device 2500. In some embodiments, clock generator 2516 receives one or more Frequency Identification (FID) signals, and generates the clock signals at an appropriate frequency, based on the FID signals. Clock generator 2516 is an adaptive clock source that can provide an adaptive frequency output as discussed with reference to various embodiments.

In some embodiments, device 2500 comprises battery 2518 supplying power to various components of device 2500. Merely as an example, battery 2518 is illustrated to be supplying power to processor 2504. Although not illustrated in the figures, device 2500 may comprise a charging circuitry, e.g., to recharge the battery, based on Alternating Current (AC) power supply received from an AC adapter.

In some embodiments, device 2500 comprises Power Control Unit (PCU) 2510 (also referred to as Power Management Unit (PMU), Power Controller, etc.). In an example, some sections of PCU 2510 may be implemented by one or more processing cores 2508, and these sections of PCU 2510 are symbolically illustrated using a dotted box and labelled PCU 2510a. In an example, some other sections of PCU 2510 may be implemented outside the processing cores 2508, and these sections of PCU 2510 are symbolically illustrated using a dotted box and labelled as PCU 2510b. PCU 2510 may implement various power management operations for device 2500. PCU 2510 may include hardware interfaces, hardware circuitries, connectors, registers, etc., as well as software components (e.g., drivers, protocol stacks), to implement various power management operations for device 2500.

In some embodiments, device 2500 comprises Power Management Integrated Circuit (PMIC) 2512, e.g., to implement various power management operations for device 2500. In some embodiments, PMIC 2512 is a Reconfigurable Power Management ICs (RPMICs) and/or an IMVP (Intel® Mobile Voltage Positioning). In an example, the PMIC is within an IC chip separate from processor 2504. The may implement various power management operations for device 2500. PMIC 2512 may include hardware interfaces, hardware circuitries, connectors, registers, etc., as well as software components (e.g., drivers, protocol stacks), to implement various power management operations for device 2500.

In an example, device 2500 comprises one or both PCU 2510 or PMIC 2512. In an example, any one of PCU 2510 or PMIC 2512 may be absent in device 2500, and hence, these components are illustrated using dotted lines.

Various power management operations of device 2500 may be performed by PCU 2510, by PMIC 2512, or by a combination of PCU 2510 and PMIC 2512. For example, PCU 2510 and/or PMIC 2512 may select a power state (e.g., P-state) for various components of device 2500. For example, PCU 2510 and/or PMIC 2512 may select a power state (e.g., in accordance with the ACPI (Advanced Configuration and Power Interface) specification) for various components of device 2500. Merely as an example, PCU 2510 and/or PMIC 2512 may cause various components of the device 2500 to transition to a sleep state, to an active state, to an appropriate C state (e.g., C0 state, or another appropriate C state, in accordance with the ACPI specification), etc. In an example, PCU 2510 and/or PMIC 2512 may control a voltage output by VR 2514 (e.g., SCVR) and/or a frequency of a clock signal output by the clock generator, e.g., by outputting the VID signal and/or the FID signal, respectively. In an example, PCU 2510 and/or PMIC 2512 may control battery power usage, charging of battery 2518, and features related to power saving operation.

The clock generator 2516 can comprise a phase locked loop (PLL), frequency locked loop (FLL), or any suitable clock source. In some embodiments, each core of processor 2504 has its own clock source. As such, each core can operate at a frequency independent of the frequency of operation of the other core. In some embodiments, PCU 2510 and/or PMIC 2512 performs adaptive or dynamic frequency scaling or adjustment. For example, clock frequency of a processor core can be increased if the core is not operating at its maximum power consumption threshold or limit. In some embodiments, PCU 2510 and/or PMIC 2512 determines the operating condition of each core of a processor, and opportunistically adjusts frequency and/or power supply voltage of that core without the core clocking source (e.g., PLL of that core) losing lock when the PCU 2510 and/or PMIC 2512 determines that the core is operating below a target performance level. For example, if a core is drawing current from a power supply rail less than a total current allocated for that core or processor 2504, then PCU 2510 and/or PMIC 2512 can temporality increase the power draw for that core or processor 2504 (e.g., by increasing clock frequency and/or power supply voltage level) so that the core or processor 2504 can perform at higher performance level. As such, voltage and/or frequency can be increased temporality for processor 2504 without violating product reliability.

In an example, PCU 2510 and/or PMIC 2512 may perform power management operations, e.g., based at least in part on receiving measurements from power measurement circuitries 2542, temperature measurement circuitries 2540, charge level of battery 2518, and/or any other appropriate information that may be used for power management. To that end, PMIC 2512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2510 and/or PMIC 2512 in at least one embodiment to allow PCU 2510 and/or PMIC 2512 to manage processor core energy at least in part based on value(s) detected by one or more of the sensors.

Also illustrated is an example software stack of device 2500 (although not all elements of the software stack are illustrated). Merely as an example, processors 2504 may execute application programs 2550, Operating System 2552, one or more Power Management (PM) specific application programs (e.g., generically referred to as PM applications 2558), and/or the like. PM applications 2558 may also be executed by the PCU 2510 and/or PMIC 2512. OS 2552 may also include one or more PM applications 2556a, 2556b, 2556c. The OS 2552 may also include various drivers 2554a, 2554b, 2554c, etc., some of which may be specific for power management purposes. In some embodiments, device 2500 may further comprise a Basic Input/Output System (BIOS) 2520. BIOS 2520 may communicate with OS 2552 (e.g., via one or more drivers 2554), communicate with processors 2504, etc.

For example, one or more of PM applications 2558, 2556, drivers 2554, BIOS 2520, etc. may be used to implement power management specific tasks, e.g., to control voltage and/or frequency of various components of device 2500, to control wake-up state, sleep state, and/or any other appropriate power state of various components of device 2500, control battery power usage, charging of the battery 2518, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1: An apparatus comprising: a first clock from a clock source, wherein the clock source is coupled to a first power supply rail; an oscillator with an adjustable frequency oscillation, wherein the oscillator is coupled to a second power supply rail, wherein the oscillator generates a second clock; a first circuitry to calibrate frequency of the second clock to be substantially same as a frequency of the first clock; a multiplexer to select one of the second clock or a divided version of the second clock, and to provide it as an output clock; and a second circuitry to count a frequency of the output clock and the first clock, and to generate a control for a voltage generator in accordance with a frequency difference between the output clock and the first clock.

Example 2: The apparatus of example 1, wherein the voltage generator is to generate a second supply on the second supply rail.

Example 3: The apparatus of example 2, wherein the second supply is provided to a load.

Example 4: The apparatus of example 3, wherein the oscillator is to automatically slow its oscillation frequency when a workload on the load increases, and then increase its oscillation frequency to be substantially same as the frequency of the first clock.

Example 5: The apparatus of example 1 comprises a flip-flop and an inverter, wherein the inverter is coupled to an output and input of the flip-flop, wherein the output of the flip-flop is to provide the divided version of the second clock.

Example 6: The apparatus of example 1, wherein the first circuitry is to generate a code indicative of a target oscillation frequency of the second clock.

Example 7: The apparatus of example 1, wherein the oscillator comprises one of a ring oscillator or an LC tank oscillator.

Example 8: The apparatus of example 1, wherein the clock source comprises a phase locked loop.

Example 9: The apparatus of example 1, wherein the second circuitry is to cause, via the control, a reduction in a voltage level of Vout in an absence of voltage droop on the second power supply rail.

Example 10: An apparatus comprising: a first clock from a clock source, wherein the clock source is coupled to a first power supply rail; and a circuitry to stretch a clock pulse of a second clock, relative to the first clock, to a load and to cause adjustment of a voltage on a second power supply rail when a droop occurs on the voltage, wherein the circuitry is to operate on the voltage from the second power supply rail, wherein the first supply rail is de-coupled from the second supply rail.

Example 11: The apparatus of example 10, wherein the circuitry is to control frequency of the second clock and the voltage on the second power supply rail simultaneously.

Example 12: The apparatus of example 10 comprise a voltage regulator to generate the voltage on the second supply rail, wherein the circuitry is to control the voltage regulator in accordance with a frequency difference between the first and second clocks.

Example 13: The apparatus of example 10, wherein the clock source comprises a phase locked loop.

Example 14: The apparatus of example 10, wherein the circuitry includes an oscillator with an adjustable frequency oscillation, wherein the oscillator is coupled to the second power supply rail, wherein the oscillator generates the second clock.

Example 15: The apparatus of example 14, wherein the oscillator is to automatically slow its oscillation frequency when a workload on the load increases, and then increase its oscillation frequency to be substantially same as the frequency of the first clock.

Example 16: The apparatus of example 10 comprises a calibration logic to calibrate frequency of the second clock to be substantially same as a frequency of the first clock.

Example 17: The apparatus of example 10 comprises a multiplexer to select one of the second clock or a divided version of the second clock, and to provide it as an output clock to the load.

Example 18: A system comprising: a memory; a processor coupled to the memory, wherein the processor includes an apparatus comprising: a first clock from a clock source, wherein the clock source is coupled to a first power supply rail; an oscillator with an adjustable frequency oscillation, wherein the oscillator is coupled to a second power supply rail, wherein the oscillator generates a second clock; a first circuitry to calibrate frequency of the second clock to be substantially same as a frequency of the first clock; a multiplexer to select one of the second clock or a divided version of the second clock, and to provide it as an output clock; and a second circuitry to count a frequency of the output clock and the first clock, and to generate a control for a voltage generator in accordance with a frequency difference between the output clock and the first clock; and a wireless interface to allow the processor to communicate with another device.

Example 19: The system of example 18, wherein the voltage generator is to generate a second supply on the second supply rail, and wherein the second supply is provided to a load.

Example 20: The system of example 19, wherein the oscillator is to automatically slow its oscillation frequency when a workload on the load increases, and then increase its oscillation frequency to be substantially same as the frequency of the first clock.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:
1. An apparatus comprising:
a first clock from a clock source, wherein the clock source is coupled to a first power supply rail;
an oscillator with an adjustable frequency oscillation, wherein the oscillator is coupled to a second power supply rail, wherein the oscillator generates a second clock;
a first circuitry to calibrate a frequency of the second clock to be substantially the same as a frequency of the first clock;
a multiplexer to select one of the second clock or a divided version of the second clock, and to provide it as an output clock; and
a second circuitry to count a frequency of the output clock and the first clock, and to generate a control for a voltage generator in accordance with a frequency difference between the output clock and the first clock.

2. The apparatus of claim 1, wherein the voltage generator is to generate a second supply on the second supply rail.

3. The apparatus of claim 2, wherein the second supply is provided to a load.

4. The apparatus of claim 3, wherein the oscillator is to automatically slow its oscillation frequency when a workload on the load increases, and then increase its oscillation frequency to be substantially the same as the frequency of the first clock.

5. The apparatus of claim 1, further comprising a flip-flop and an inverter, wherein the inverter is coupled to an output and input of the flip-flop, wherein the output of the flip-flop is to provide the divided version of the second clock.

6. The apparatus of claim 1, wherein the first circuitry is to generate a code indicative of a target oscillation frequency of the second clock.

7. The apparatus of claim 1, wherein the oscillator comprises one of a ring oscillator or an LC tank oscillator.

8. The apparatus of claim 1, wherein the clock source comprises a phase locked loop.

9. The apparatus of claim 1, wherein the second circuitry is to cause, via the control, a reduction in a voltage level of Vout in an absence of voltage droop on the second power supply rail.

10. An apparatus comprising:
a first clock from a clock source, wherein the clock source is coupled to a first power supply rail;
a circuitry to stretch a clock pulse of a second clock, relative to the first clock, to a load and to cause adjustment of a voltage on a second power supply rail when a droop occurs on the voltage, wherein the circuitry is to operate on the voltage from the second power supply rail, wherein the first supply rail is de-coupled from the second supply rail; and
a voltage regulator to generate the voltage on the second supply rail, wherein the circuitry is to control the voltage regulator in accordance with a frequency difference between the first and second clocks.

11. The apparatus of claim 10, wherein the circuitry is to control a frequency of the second clock and the voltage on the second power supply rail simultaneously.

12. The apparatus of claim 10, wherein the clock source comprises a phase locked loop.

13. The apparatus of claim 10, wherein the circuitry includes an oscillator with an adjustable frequency oscillation, wherein the oscillator is coupled to the second power supply rail, wherein the oscillator generates the second clock.

14. The apparatus of claim 13, wherein the oscillator is to automatically slow its oscillation frequency when a workload on the load increases, and then increase its oscillation frequency to be substantially the same as the frequency of the first clock.

15. The apparatus of claim 10, further comprising a calibration logic to calibrate a frequency of the second clock to be substantially the same as a frequency of the first clock.

16. The apparatus of claim 10, further comprising a multiplexer to select one of the second clock or a divided version of the second clock, and to provide it as an output clock to the load.

17. A system comprising:
a memory;
a processor coupled to the memory, wherein the processor includes an apparatus comprising:
a first clock from a clock source, wherein the clock source is coupled to a first power supply rail;
an oscillator with an adjustable frequency oscillation, wherein the oscillator is coupled to a second power supply rail, wherein the oscillator generates a second clock;
a first circuitry to calibrate a frequency of the second clock to be substantially the same as a frequency of the first clock;
a multiplexer to select one of the second clock or a divided version of the second clock, and to provide it as an output clock; and
a second circuitry to count a frequency of the output clock and the first clock, and to generate a control for a voltage generator in accordance with a frequency difference between the output clock and the first clock; and
a wireless interface to allow the processor to communicate with another device.

18. The system of claim 17, wherein the voltage generator is to generate a second supply on the second supply rail, and wherein the second supply is provided to a load.

19. The system of claim 18, wherein the oscillator is to automatically slow its oscillation frequency when a workload on the load increases, and then increase its oscillation frequency to be substantially the same as the frequency of the first clock.

* * * * *